United States Patent
Popp

(10) Patent No.: US 7,683,472 B2
(45) Date of Patent: *Mar. 23, 2010

(54) POWER SEMICONDUCTOR MODULES AND METHOD FOR PRODUCING THEM

(75) Inventor: Rainer Popp, Petersaurach (DE)

(73) Assignee: SEMIKRON Electronik GmbH & Co. KG, Nürnberg (DE)

( * ) Notice: Subject to any disclaimer, the term of this patent is extended or adjusted under 35 U.S.C. 154(b) by 267 days.

This patent is subject to a terminal disclaimer.

(21) Appl. No.: 11/705,719

(22) Filed: Feb. 13, 2007

(65) Prior Publication Data
US 2007/0187817 A1  Aug. 16, 2007

(30) Foreign Application Priority Data
Feb. 13, 2006 (DE) .................. 10 2006 006 423

(51) Int. Cl.
*H01L 23/34* (2006.01)
(52) U.S. Cl. .................. 257/690; 257/723; 257/666; 257/678; 257/691; 257/701; 257/E21.519; 257/E23.001; 257/E23.194; 257/E21.499
(58) Field of Classification Search .................. 257/690, 257/723, 701, 691, 678, 666, E23.001, E23.194, 257/E21.499, E21.519
See application file for complete search history.

(56) References Cited

U.S. PATENT DOCUMENTS

| 2004/0061221 A1* | 4/2004 | Schaffer | 257/723 |
| 2007/0090496 A1* | 4/2007 | Otremba | 257/666 |
| 2007/0194429 A1* | 8/2007 | Lederer et al. | 257/688 |
| 2007/0194443 A1* | 8/2007 | Lederer et al. | 257/723 |

FOREIGN PATENT DOCUMENTS

| DE | 42 37 632 | 5/1994 |
| DE | 197 19 703 | 11/1998 |
| DE | 199 03 875 | 8/2000 |
| DE | 101 27 947 | 10/2002 |

* cited by examiner

*Primary Examiner*—Wael Fahmy
*Assistant Examiner*—Marc Armand
(74) *Attorney, Agent, or Firm*—Cohen Pontani Lieberman & Pavane LLP

(57) ABSTRACT

A power semiconductor module in a pressure contact embodiment and a method for producing such modules, for disposition on a cooling component. Load terminals of the modules are formed as metal molded bodies having at least one contact element, one flat portion, and contact feet emanating therefrom. Each flat portion is disposed parallel to, and spaced from, the surface of the substrate. The contact feet extend from the flat portion to the substrate. An elastic intermediate layer is disposed between adjacent load terminals, in the region of the respective flat portions, and the intermediate layer and load terminals form a stack.

9 Claims, 2 Drawing Sheets

POWER SEMICONDUCTOR MODULES AND METHOD FOR PRODUCING THEM

BACKGROUND OF THE INVENTION

1. Field of the Invention

The present invention is directed to the field of power semiconductor modules and, more particularly, to a power semiconductor module having a pressure contact embodiment, for disposition on a cooling component, and a method for producing such a semiconductor module.

2. Description of the Related Art

In the prior art, such as German Patent Application No. DE 197 19 703 A1, known power semiconductor modules comprise a housing with at least one electrically insulating substrate disposed thereon, preferably for direct mounting on a cooling component. The substrate in turn includes an insulation body having a plurality of metal connection tracks located thereon. The connection tracks are insulated from one another. Power semiconductor components are located on, and connected to, these connection tracks. Moreover, known power semiconductor modules have terminals for external load and auxiliary terminals and also have internally located connecting elements. These connecting elements are usually wire bond connections.

Pressure-contact power semiconductor modules are also known, of the kind disclosed in German Patent Applications Nos. DE 42 37 632 A1 and DE 199 03 875 A1, or in German Patent No. DE 101 27 947 C1. In the first of these references, the pressure device has a stable, preferably metal, pressure element for pressure buildup, an elastic pad element for pressure storage, and a bridge element for introducing pressure to separate regions of the substrate surface. The bridge element is preferably formed as a molded plastic body with a face oriented toward the pad element, from which face many pressure prongs radiate in the direction of the substrate surface.

By means of this kind of pressure device, the substrate is pressed against a cooling component, and the heat transfer between the substrate and the cooling component is thus permanently assured. The elastic pad element generally maintains constant pressure conditions under various thermal loads and over the entire service life of the power semiconductor module.

German Application No. DE 199 03 875 A1 develops this known pressure element further so that, on the one hand, it has an especially advantageous ratio of weight to stability, and, on the other hand, it has electrically insulated leadthroughs. To that end, the pressure element is formed as a molded plastic body over a metal core. This metal core has recesses for the leadthrough of terminals, preferably auxiliary terminals in a spring contact embodiment. The molded plastic body surrounds these recesses in such a way that the auxiliary terminals are electrically insulated from the metal core by the plastic molded body.

Further-developed pressure elements are also known which have many pressure prongs on their surface oriented toward the substrate. Preferably, the metal core also has a pre-set sag. When the two provisions are combined, a pressure element of this kind can furnish the entire functionality of an aforementioned pressure device.

German Patent No. DE 101 57 947 C1, describes a power semiconductor module in which the load terminals are embodied such that they extend in portions closely adjacent to and perpendicular to the substrate surface and have contact feet extending therefrom that furnish the electrical contact with the conductor tracks while at the same time exerting pressure on the substrate and thereby establish its thermal contact with a cooling component. The pressure is introduced and stored using means of the prior art.

SUMMARY OF THE INVENTION

It is therefore an object of the invention to provide improved power semiconductor modules and an improved method for producing them.

It is a further object of the invention to provide a simple power semiconductor module having a pressure contact embodiment.

It is another object of the invention to provide a power semiconductor module having a pressure contact embodiment in which the internal insulation of the power semiconductor module is improved.

The preferred embodiment of the invention includes an arrangement of a power semiconductor module in a pressure contact embodiment disposed on a cooling component. The power semiconductor module includes: a substrate; at least two power semiconductor components, such as bipolar transistors, located on the substrate; a housing; and load terminals and control terminals leading to the outside of the housing. The substrate itself has an insulation body, and on the first main face of the insulation body, oriented toward the interior of the power semiconductor module, it has conductor tracks with load potential. The substrate preferably also has at least one conductor track with control potential for triggering the power semiconductor components.

The power semiconductor module furthermore has load terminals each having a contact device, a flat portion, and a plurality of contact feet extending from the flat portion. The various flat portions are disposed parallel to, and spaced from, the substrate surface. The contact feet extend to the substrate, where they contact the load terminals. For that purpose, they preferably contact the conductor tracks with load potential on the substrate, but alternatively they also contact the power semiconductor components directly.

According to an embodiment of the invention, the load terminals form a stack, and an elastic intermediate layer is disposed between adjacent load terminals in the region of their respective flat portions. This arrangement of a plurality of elastic intermediate layers, compared to the prior art having only one pressure-storing means, has the advantage that the individual load terminals are disposed not rigidly but rather flexibly with respect to one another, and, as a result, the security of their contact is improved substantially. Moreover, manufacturing tolerances in the length of the respective contact feet of the individual load terminals to one another are compensated for. Because of the embodiment according to the invention of the stack of the load terminals, all the contact feet press against their respective contact points on the substrate or on the power semiconductor components with substantially equal force.

Preferably, the associated method for producing an arrangement as described above has the following steps:
Producing the stack from load terminals with intermediate layers;
Disposing the stack in the housing of the power semiconductor module;
Disposing the pressure device above the stack;
Preliminarily locking the pressure device on or in the housing; and
Disposing at least one substrate, with power semiconductor components disposed thereon, in a recess in the housing.

It is especially preferable if the flat portions of the load terminals and the contact feet are produced from a flat metal body by stamping and bending and are joined to contact devices and then laminated into the stack with an elastic intermediate layer.

This production method has the advantage that, because of the prefabricated stack, only a few individual components have to be disposed relative to one another upon assembly of the power semiconductor module.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The embodiment according to the invention will be described in further detail in terms of the exemplary embodiments of FIGS. 1 and 2, in which like numerals represent like elements.

DETAILED DESCRIPTION OF THE PRESENTLY PREFERRED EMBODIMENTS

Figure 1:
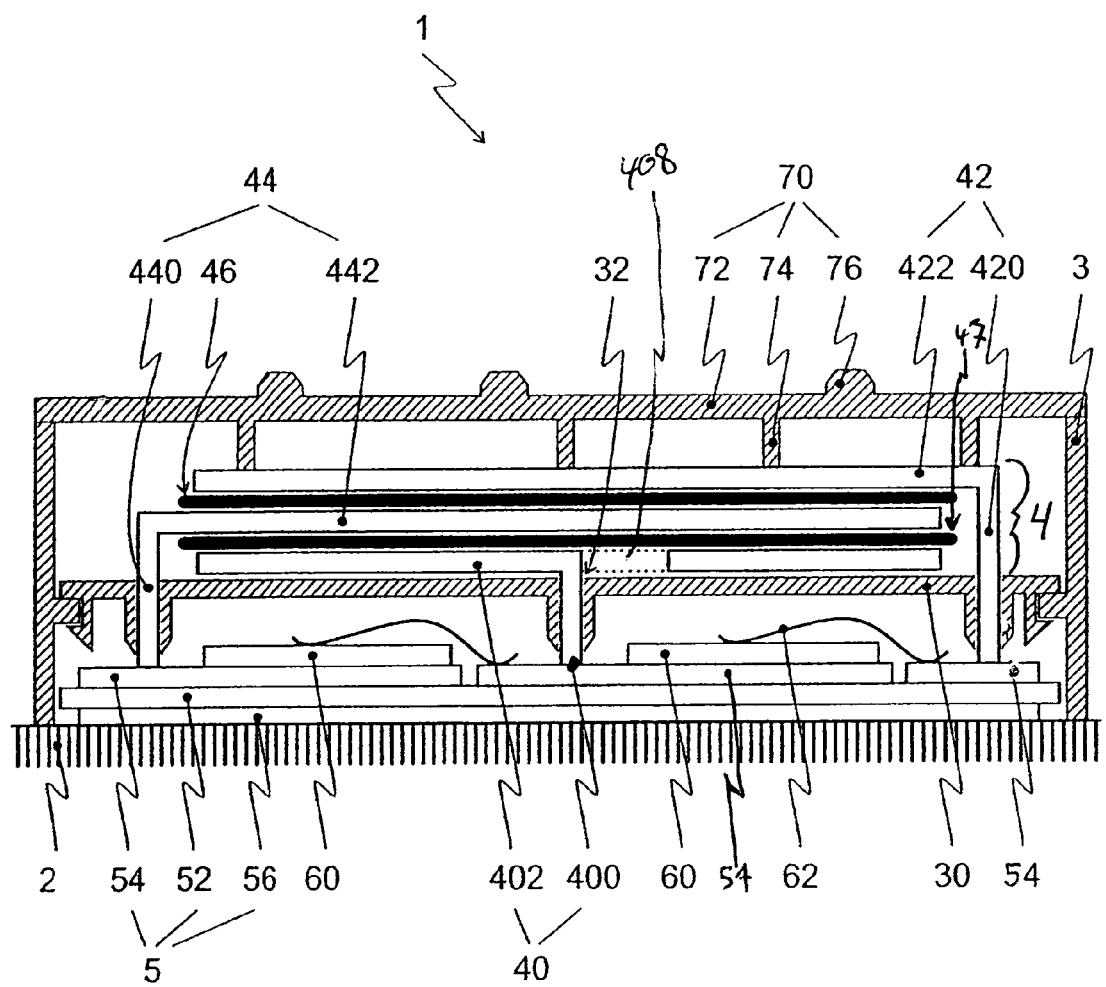
FIG. 1 shows a cross-section through a power semiconductor module of a preferred embodiment of the invention.

FIG. 1 shows a section through a power semiconductor module 1 of the invention. Module 1 has a housing 3 with a framelike housing part that is solidly connected to a cooling component 2. Housing 3 surrounds at least one substrate 5. Substrate 5 includes an insulation body 52, preferably formed of an insulating ceramic, such as aluminum oxide or aluminum nitride.

A first main face of substrate 5 is oriented toward the interior of power semiconductor module 1, and has an intrinsically structured metal lining. The individual portions of this metal lining, preferably formed as a copper lining, form conductor tracks 54 of power semiconductor module 1. The second, opposite, main face of substrate 5, as in the prior art, has an unstructured copper lining 56.

Controllable and/or uncontrolled power semiconductor components 60, such as IGBTs (insulated gate bipolar transistors), each with antiparallel-connected fly-wheel diodes, or MOSFETs, are disposed on conductor tracks 54 of substrate 5. These are connected to further conductor tracks 54, for instance by means of wire bond connections 62.

Power semiconductor module 1 contains a power electronic circuit which has connections to the exterior of housing 3 formed by load terminals 40, 42, 44. Load terminals 40, 42, 44 are preferably formed as metal molded bodies, which each have one flat portion 402, 422, 442 respectively disposed parallel to the surface of substrate 5. Flat portions 402, 422, 442 are preferably disposed one atop the other to form thereby a stack 4, with the flat portions of the individual load terminals 40, 42, 44 spaced apart from one another and electrically insulated from one another by resilient intermediate layers 46, 47, each preferably formed as a silicone pad at least 1 mm thick. It is especially preferred if silicone pads 46, 47 are adhesively bonded to the flat portions, since stack 4 may thus be embodied conveniently as an assembled unit. In this sectional view, for the sake of simplicity, the auxiliary terminals which would be required for operation are not shown.

Power semiconductor module 1 preferably has an intermediate layer, embodied as a molded insulation body 30, between stack 4 of flat portions 402, 422, 442 of load terminals 40, 42, 44 and substrate 5. Molded insulation body 30 has openings 32 therein for permitting passage therethrough of contact feet 400, 420, 440 of load terminals 40, 42, 44.

Power semiconductor module 1 also includes a pressure device 70 for thermally connecting power semiconductor module 1 to cooling component 2 and simultaneously for electrically connecting load terminals 40, 42, 44 to conductor tracks 54. Pressure device 70 is preferably formed by a pressure element 72 for pressure buildup on stack 4. To that end, pressure element 72 has pressure prongs 74 extending therefrom in accordance with the prior art. In an alternate embodiment of the invention, a further elastic layer similar to intermediate layer 46 may be disposed between pressure element 72, which has a flat underside, and stack 4.

Pressure element 72 may also be embodied, as in the prior art, as a plastic molded body with a suitable metal core on the inside and with external reinforcement structures 76. It is also preferable that pressure element 72 serves simultaneously as a cap for power semiconductor module 1.

Figure 2:
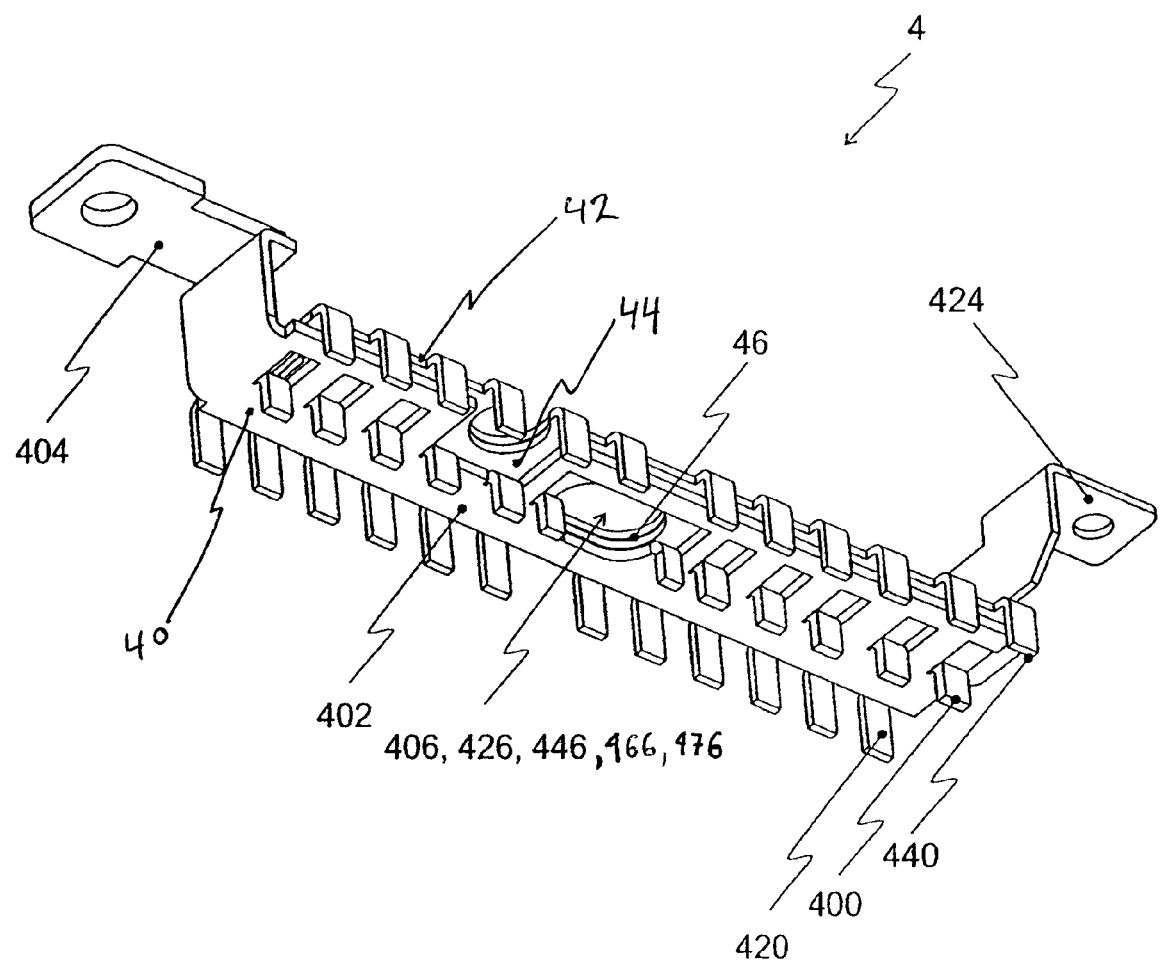
FIG. 2 is a perspective, showing a stack of load terminals of the power semiconductor module of a preferred embodiment of the invention.

FIG. 2 shows stack 4 of load terminals 40, 42, 44 of the power semiconductor module 1 of the invention. Load terminals 40, 42, 44 are shown, which have a plurality of contact feet 400, 420, 440, respectively, that originate at the associated flat portions 402, 422, 442. Feet 400, 420, 440 are preferably formed by stamping or bending. Feet 400 are displaced from the middle of flat portion 40, and so their formation leaves gaps 408 in flat portion 40. Since feet 420, 440 are formed at the edges of flat portion 42, 44, no such gaps are formed.

Load terminals 40, 42 include contact devices 404, 424, respectively for providing contact with circuitry external to housing 3 of power semiconductor module 1. Load terminals 44 has a similar contact device which is not seen in FIG. 2. Elastic intermediate layers 46, 47 simultaneously provide electrical insulation between adjacent load terminals 40, 42, 44, and form a pressure-transmitting pressure-storing element of the power semiconductor module to transmit the pressure imparted by pressure device 70 to stack 4.

It is especially advantageous if load terminals 40, 42, 44 are joined to intermediate layers 46, 47 in the region of flat portions 402, 422, 442, to make a single assembled unit. This can advantageously be accomplished by adhesively bonding them together. However, it is especially preferable if these elements are laminated together.

Stack 4 furthermore has recesses 406, 426, 446, 466, 476 in flat portions 402, 422, 442 and in intermediate layers 46, 47 for permitting passage therethrough of auxiliary terminals, not shown, embodied as helical springs.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module for use in a pressure contact environment, and for disposition on a cooling component, the power semiconductor module comprising:
   a) a substrate having
      an insulation body, and
      conductor tracks disposed on a first main face of said substrate, said first main face being oriented toward the interior of the power semiconductor module;
   b) at least two power semiconductor components disposed on said substrate and electrically connected to said conductor tracks;
   c) a housing forming a portion of the exterior of said power semiconductor module;
   d) at least two conductive load terminals, each of said load terminals having
      at least one contact element;
      a generally flat portion disposed parallel to, and spaced from, said first main face of said substrate;
      a plurality of contact feet extending from said flat portion and contacting said substrate; and
      control terminals leading to the exterior of said power semiconductor module;
   e) an elastic intermediate layer disposed between at least one pair of adjacent load terminals in the region of said respective flat portions thereof, wherein said load terminals and said elastic intermediate layer form a stack; and
   f) a pressure device for exerting pressure on said stack to maintain said stack in a desired position in said housing.

2. The power semiconductor module of claim 1, wherein said elastic intermediate layer is formed as a silicone pad having a minimum thickness of about 1 mm.

3. The power semiconductor module of claim 1, wherein said elastic intermediate layer electrically insulates said pair of load terminals from one another.

4. The power semiconductor module of claim 3,
   wherein parts of said flat portions of said load terminals are disposed proximate each other to form thereby said stack, said load terminals being insulated electrically from one another by said elastic intermediate layer; and
   wherein said pressure device exerts pressure on said stack, and thereby urges said load terminals into electrical contact with said conductor tracks.

5. The power semiconductor module of claim 1, wherein said pressure device includes at least one pressure element for exerting pressure on said stack.

6. The power semiconductor module of claim 5, further comprising a second elastic insulating layer disposed between said pressure element and said stack.

7. The power semiconductor module of claim 1, wherein said load terminals and said elastic intermediate layer are attached together by adhesive bonding.

8. The power semiconductor module of claim 1, wherein said load terminals and said elastic intermediate layer are laminated together.

9. The power semiconductor module of claim 1, wherein said pressure device and said stack have respective recesses therein for permitting passage therethrough of auxiliary terminals.

* * * * *